United States Patent
Liepold et al.

(10) Patent No.: US 8,779,783 B1
(45) Date of Patent: Jul. 15, 2014

(54) MUTUAL CAPACITANCE SENSING USING A SELF-CAPACITANCE SENSING DEVICE

(71) Applicant: Cypress Semiconductor Corporation, San Jose, CA (US)

(72) Inventors: Carl F Liepold, San Jose, CA (US); Hans Van Antwerpen, Mountain View, CA (US); John Kizziar, Spokane, WA (US); Hans Klein, Pleasanton, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/917,163

(22) Filed: Jun. 13, 2013

Related U.S. Application Data

(60) Provisional application No. 61/777,570, filed on Mar. 12, 2013.

(51) Int. Cl.
*G01R 27/26* (2006.01)

(52) U.S. Cl.
CPC .................................. *G01R 27/2605* (2013.01)
USPC ........... 324/686; 324/658; 324/678; 324/679; 324/684; 345/174

(58) Field of Classification Search
CPC ....... G06F 3/0416; G06F 3/041; G06F 3/044; G02F 1/13338; G01R 27/26; G01R 27/2605
See application file for complete search history.

(56) References Cited

U.S. PATENT DOCUMENTS

| | | | | |
|---|---|---|---|---|
| 5,565,658 A * | 10/1996 | Gerpheide et al. | ......... | 178/18.02 |
| 5,736,865 A * | 4/1998 | Nelson et al. | ................. | 324/660 |
| 7,015,659 B2 * | 3/2006 | Yeh | ................................ | 315/312 |
| 7,940,100 B2 * | 5/2011 | Keskin et al. | ................. | 327/161 |
| 8,358,142 B2 | 1/2013 | Maharyta | | |
| 8,363,031 B2 | 1/2013 | Geaghan | | |
| 2008/0111714 A1 | 5/2008 | Kremin | | |
| 2011/0025629 A1 * | 2/2011 | Grivna et al. | ................. | 345/173 |
| 2011/0102061 A1 * | 5/2011 | Wang et al. | ................... | 327/517 |
| 2011/0205094 A1 * | 8/2011 | Ashmore, Jr. | ................. | 341/120 |

(Continued)

FOREIGN PATENT DOCUMENTS

WO 2010111668 A1 9/2010

OTHER PUBLICATIONS

Cypress Semiconductor Corporation, "Getting Started with Capsense®" Document No. 001-64846 Rev.*1, 2010-2013. 75 pages.

(Continued)

*Primary Examiner* — Huy Q Phan
*Assistant Examiner* — James Split

(57) ABSTRACT

Apparatuses and methods of mutual-capacitance sensing with a capacitance-sensing circuit, such as a self-capacitance sensing device (CSD). One apparatus includes an input node coupled to a capacitance sense pin to couple to a first electrode of a sense array, a transmit (TX) signal generation circuit to generate a TX signal to drive a second electrode of the sense array, logic circuitry coupled to the TX signal generation circuit and the input node. The logic circuitry is configured to selectively couple a first capacitor to the input node and a second capacitor to the input node timed with the TX signal. The apparatus further includes an analog-to-digital converter (ADC) coupled to receive a receive (RX) signal from the input node and to convert the RX signal into a digital value, the digital value representing a mutual capacitance between the first electrode and the second electrode.

16 Claims, 13 Drawing Sheets

(56) References Cited

U.S. PATENT DOCUMENTS

| | | |
|---|---|---|
| 2012/0043971 A1* | 2/2012 | Maharyta ............... 324/658 |
| 2012/0043973 A1* | 2/2012 | Kremin ............... 324/658 |
| 2012/0049868 A1* | 3/2012 | Maharyta ............... 324/679 |
| 2012/0050213 A1* | 3/2012 | Bokma ............... 345/174 |
| 2012/0050214 A1 | 3/2012 | Hutnyk et al. |
| 2012/0169661 A1* | 7/2012 | Chan et al. ............... 345/174 |
| 2012/0212240 A1 | 8/2012 | Young |
| 2012/0256869 A1* | 10/2012 | Walsh et al. ............... 345/174 |
| 2013/0021294 A1 | 1/2013 | Bihday |
| 2013/0038476 A1* | 2/2013 | Pedersen ............... 341/110 |
| 2013/0038566 A1* | 2/2013 | Singh et al. ............... 345/174 |
| 2013/0076643 A1 | 3/2013 | Peterson |
| 2013/0082719 A1 | 4/2013 | Prendergast et al. |
| 2013/0147496 A1* | 6/2013 | Moedl et al. ............... 324/679 |

OTHER PUBLICATIONS

Search Report for "Mutual Capacitance Sensing Solution Using CSD", dated May 2013, 4 pages.
International Search Report for International Application No. PCT/US14/19649 dated Apr. 4, 2014; 4 pages.
Written Opinion of the International Searching Authority for International Application No. PCT/US14/19649 dated Apr. 4, 2014; 13 pages.

* cited by examiner

MUTUAL CAPACITANCE SENSING USING A SELF-CAPACITANCE SENSING DEVICE

RELATED APPLICATIONS

This application claims the benefit of U.S. Provisional Application No. 61/777,570, filed Mar. 12, 2013, the entire contents of which are incorporated by reference herein.

TECHNICAL FIELD

The present disclosure relates generally to sensing systems, and more particularly to capacitance-sensing systems configurable to determine touch locations of touches on the capacitive-sensing systems.

BACKGROUND

Capacitance sensing systems can sense electrical signals generated on electrodes that reflect changes in capacitance. Such changes in capacitance can indicate a touch event (i.e., the proximity of an object to particular electrodes). Capacitive sense elements may be used to replace mechanical buttons, knobs and other similar mechanical user interface controls. The use of a capacitive sense element allows for the elimination of complicated mechanical switches and buttons, providing reliable operation under harsh conditions. In addition, capacitive sense elements are widely used in modern customer applications, providing new user interface options in existing products. Capacitive sense elements can range from a single button to a large number arranged in the form of a capacitive sense array for a touch-sensing surface.

Transparent touch screens that utilize capacitive sense arrays are ubiquitous in today's industrial and consumer markets. They can be found on cellular phones, GPS devices, set-top boxes, cameras, computer screens, MP3 players, digital tablets, and the like. The capacitive sense arrays work by measuring the capacitance of a capacitive sense element, and looking for a delta in capacitance indicating a touch or presence of a conductive object. When a conductive object (e.g., a finger, hand, or other object) comes into contact or close proximity with a capacitive sense element, the capacitance changes and the conductive object is detected. The capacitance changes of the capacitive touch sense elements can be measured by an electrical circuit. The electrical circuit converts the measured capacitances of the capacitive sense elements into digital values.

There are two typical types of capacitance: 1) mutual capacitance where the capacitance-sensing circuit has access to both electrodes of the capacitor; 2) self capacitance where the capacitance-sensing circuit has only access to one electrode of the capacitor where the second electrode is tied to a DC voltage level or is parasitically coupled to Earth Ground. A touch panel has a distributed load of capacitance of both types (1) and (2) and Cypress' touch solutions sense both capacitances either uniquely or in hybrid form with its various sense modes.

BRIEF DESCRIPTION OF THE DRAWINGS

The present invention is illustrated by way of example, and not of limitation, in the figures of the accompanying drawings.

DETAILED DESCRIPTION

In the following description, for purposes of explanation, numerous specific details are set forth in order to provide a thorough understanding of the present invention. It will be evident, however, to one skilled in the art that the present invention may be practiced without these specific details. In other instances, well-known circuits, structures, and techniques are not shown in detail, but rather in a block diagram in order to avoid unnecessarily obscuring an understanding of this description.

Reference in the description to "one embodiment" or "an embodiment" means that a particular feature, structure, or characteristic described in connection with the embodiment is included in at least one embodiment of the invention. The phrase "in one embodiment" located in various places in this description does not necessarily refer to the same embodiment.

Apparatuses and methods of mutual-capacitance sensing with a capacitance-sensing circuit, such as a self-capacitance sensing device (CSD). One apparatus includes an input node (e.g., MUXBUSA as described herein) coupled to a capacitance sense pin to couple to a first electrode of a sense array; a transmit (TX) signal generation circuit to generate a TX signal to drive a second electrode of the sense array; logic circuitry coupled to the TX signal generation circuit and the input node, wherein the logic circuitry is configured to selectively couple a first capacitor to the input node and a second capacitor to the input node timed with the TX signal; and an analog-to-digital converter (ADC) coupled to receive a receive (RX) signal from the input node and to convert the RX signal into a digital value, the digital value representing a mutual capacitance between the first electrode and the second electrode. It should be noted that the term capacitor, as used herein, may refer to any combination of conductors and dielectrics that produce a capacitance between the conductors, as well as discrete components. For example, as described herein, a capacitance can created as an intersection between two electrodes. In other cases, a discrete capacitor may be used to produce a capacitance.

Figure 1:
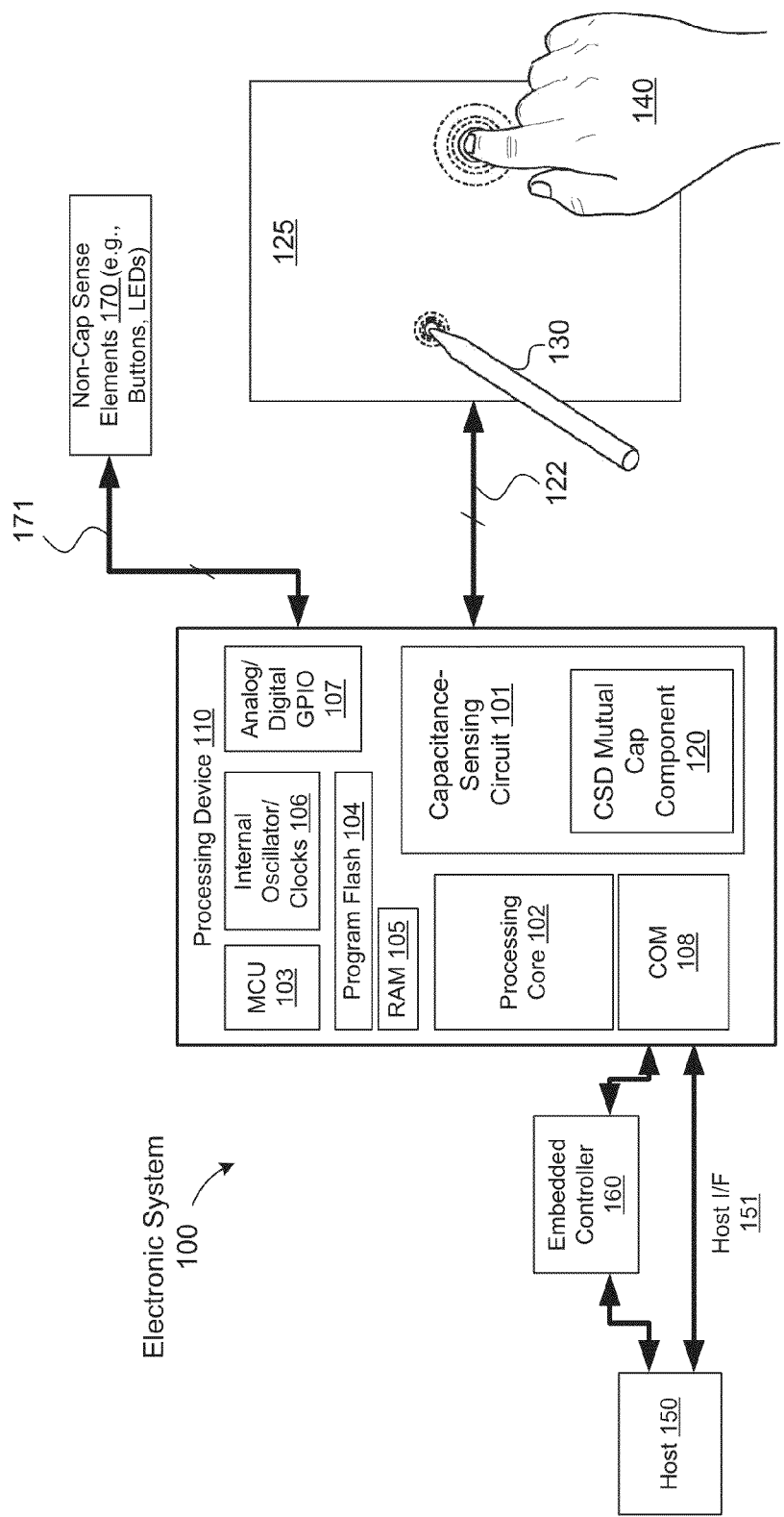
FIG. 1 is a block diagram illustrating one embodiment of an electronic system having a processing device including a self-capacitance device (CSD) component configurable for mutual capacitance sensing (hereinafter "CSD mutual capacitance component").

FIG. 1 is a block diagram illustrating one embodiment of an electronic system 100 having a processing device 110 including CSD mutual capacitance component 120. Details regarding the CSD Mutual Cap component 120 are described in more detail with respect to FIGS. 2-14B. CSD is typically used for touch sense buttons, sliders, touchpad and proximity detection using self-capacitance sensing. The embodiments described below are directed to a CSD mutual cap component 120 that is configured for mutual-capacitance sensing. The CSD mutual cap component 120 may use multiple off-chip capacitors, and on-chip analog multiplexer buses, programmable current sources (referred to as IDACs), comparators, and counters for mutual-capacitance sensing. This may allow any capacitance sensing pin (CS pin) (and any combination of them) to be used for transmit (TX) or receive (RX) concurrently, and even simultaneously. The off-chip capacitors (capacitors that reside external to the integrated circuit die of the capacitance-sensing circuit) can be used to for mutual capacitance, as described herein, as well as for self-capacitance sensing, shielding, waterproofing, proximity sensing, or the like. There are other embodiments where the capacitors are on-chip capacitors; however, on-chip capacitors may be expensive in terms of real estate on the integrated circuit, as well as in terms of manufacturing. The CSD mutual cap component 120, as described herein, may allow a simple, and relatively cheap capacitance-sensing circuit to be used for potentially expensive mutual-capacitance sensing solutions. For example, the CSD mutual cap component 120 may be used in a relatively cheap touch panel of a mobile phone, permitting mutual-capacitance sensing for multi-finger touch support, higher accuracy of finger movement, etc.

The processing device 110 is configured to detect one or more touches on a touch-sensing device, such as the capacitive sense array 125. The processing device can detect conductive objects, such as touch objects 140 (fingers or passive styluses, an active stylus 130, or any combination thereof. The capacitance-sensing circuit 101 can measure touch data on the capacitive sense array 125. The touch data may be represented as multiple cells, each cell representing an intersection of sense elements (e.g., electrodes) of the capacitive sense array 125. In another embodiment, the touch data is a 2D capacitive image of the capacitive sense array 125. In one embodiment, when the capacitance-sensing circuit 101 measures mutual capacitance of the touch-sensing device (e.g., capacitive sense array 125), the capacitance-sensing circuit 101 obtains a 2D capacitive image of the touch-sensing device and processes the data for peaks and positional information. In another embodiment, the processing device 110 is a microcontroller that obtains a capacitance touch signal data set, such as from a sense array, and finger detection firmware executing on the microcontroller identifies data set areas that indicate touches, detects and processes peaks, calculates the coordinates, or any combination therefore. The firmware identifies the peaks using the embodiments described herein. The firmware can calculate a precise coordinate for the resulting peaks. In one embodiment, the firmware can calculate the precise coordinates for the resulting peaks using a centroid algorithm, which calculates a centroid of the touch, the centroid being a center of mass of the touch. The centroid may be an X/Y coordinate of the touch. Alternatively, other coordinate interpolation algorithms may be used to determine the coordinates of the resulting peaks. The microcontroller can report the precise coordinates to a host processor, as well as other information.

Electronic system 100 includes processing device 110, capacitive sense array 125, stylus 130, host processor 150, embedded controller 160, and non-capacitive sense elements 170. The capacitive sense elements are electrodes of conductive material, such as copper. The sense elements may also be part of an ITO panel. The capacitive sense elements can be configurable to allow the capacitive-sensing circuit 101 to measure self capacitance, mutual capacitance, or any combination thereof. In the depicted embodiment, the electronic system 100 includes the capacitive sense array 125 coupled to the processing device 110 via bus 122. The capacitive sense array 125 may include a multi-dimension capacitive sense array. The multi-dimension sense array includes multiple sense elements, organized as rows and columns. In another embodiment, the capacitive sense array 125 operates as an all-points-addressable ("APA") mutual capacitive sense array. In another embodiment, the capacitive sense array 125 operates as a coupled-charge receiver. In another embodiment, the capacitive sense array 125 is non-transparent capacitive sense array (e.g., PC touchpad). The capacitive sense array 125 may be disposed to have a flat surface profile. Alternatively, the capacitive sense array 125 may have non-flat surface profiles. Alternatively, other configurations of capacitive sense arrays may be used. For example, instead of vertical columns and horizontal rows, the capacitive sense array 125 may have a hexagon arrangement, or the like, as would be appreciated by one of ordinary skill in the art having the benefit of this disclosure. In one embodiment, the capacitive sense array 125 may be included in an ITO panel or a touch screen panel.

The operations and configurations of the processing device 110 and the capacitive sense array 125 for detecting and tracking the touch object 140 and stylus 130 are described herein. In short, the processing device 110 is configurable to detect a presence of the touch object 140, a presence of a stylus 130 on the capacitive sense array 125, or any combination thereof. The processing device 110 may detect and track the stylus 130 and the touch object 140 individually on the capacitive sense array 125. In one embodiment, the processing device 110 can detect and track both the stylus 130 and touch object 140 concurrently on the capacitive sense array 125. If the touching object is an active stylus, in one embodiment, the active stylus 130 is configurable to operate as the timing "master," and the processing device 110 adjusts the timing of the capacitive sense array 125 to match that of the active stylus 130 when the active stylus 130 is in use. In one embodiment, the capacitive sense array 125 capacitively couples with the active stylus 130, as opposed to conventional inductive stylus applications. It should also be noted that the same assembly used for the capacitive sense array 125, which is configurable to detect touch objects 140, is also used to detect and track a stylus 130 without an additional PCB layer for inductively tracking the active stylus 130.

In the depicted embodiment, the processing device 110 includes analog and/or digital general purpose input/output ("GPIO") ports 107. GPIO ports 107 may be programmable. GPIO ports 107 may be coupled to a Programmable Interconnect and Logic ("PIL"), which acts as an interconnect between GPIO ports 107 and a digital block array of the processing device 110 (not shown). The digital block array may be configurable to implement a variety of digital logic circuits (e.g., DACs, digital filters, or digital control systems) using, in one embodiment, configurable user modules ("UMs"). The digital block array may be coupled to a system bus. Processing device 110 may also include memory, such as random access memory ("RAM") 105 and program flash 104. RAM 105 may be static RAM ("SRAM"), and program flash 104 may be a non-volatile storage, which may be used to store firmware (e.g., control algorithms executable by processing core 102 to implement operations described herein). Processing device 110 may also include a memory controller unit ("MCU") 103 coupled to memory and the processing core 102. The processing core 102 is a processing element configured to execute instructions or perform operations. The processing device 110 may include other processing elements as would be appreciated by one of ordinary skill in the art having the benefit of this disclosure. It should also be noted that the memory may be internal to the processing device or external to it. In the case of the memory being internal, the memory may be coupled to a processing element, such as the processing core 102. In the case of the memory being external to the processing device, the processing device is coupled to the other device in which the memory resides as would be appreciated by one of ordinary skill in the art having the benefit of this disclosure.

The processing device 110 may also include an analog block array (not shown). The analog block array is also coupled to the system bus. Analog block array may also be configurable to implement a variety of analog circuits (e.g., ADCs or analog filters) using, in one embodiment, configurable UMs. The analog block array may also be coupled to the GPIO 107.

As illustrated, capacitance-sensing circuit 101 may be integrated into processing device 110. Capacitance-sensing circuit 101 may include analog I/O for coupling to an external component, such as touch-sensor pad (not shown), capacitive sense array 125, touch-sensor slider (not shown), touch-sensor buttons (not shown), and/or other devices. The capacitance-sensing circuit 101 may be configurable to measure capacitance using mutual-capacitance sensing techniques, self-capacitance sensing technique, charge coupling techniques or the like. In one embodiment, capacitance-sensing circuit 101 operates using a charge accumulation circuit, a capacitance modulation circuit, or other capacitance sensing methods known by those skilled in the art. In an embodiment, the capacitance-sensing circuit 101 is of the Cypress TMA-3xx, TMA-4xx, or TMA-xx families of touch screen controllers. Alternatively, other capacitance-sensing circuits may be used. The mutual capacitive sense arrays, or touch screens, as described herein, may include a transparent, conductive sense array disposed on, in, or under either a visual display itself (e.g. LCD monitor), or a transparent substrate in front of the display. In an embodiment, the TX and RX electrodes are configured in rows and columns, respectively. It should be noted that the rows and columns of electrodes can be configured as TX or RX electrodes by the capacitance-sensing circuit 101 in any chosen combination. In one embodiment, the TX and RX electrodes of the sense array 125 are configurable to operate as a TX and RX electrodes of a mutual capacitive sense array in a first mode to detect touch objects, and to operate as electrodes of a coupled-charge receiver in a second mode to detect a stylus on the same electrodes of the sense array. The stylus, which generates a stylus TX signal when activated, is used to couple charge to the capacitive sense array, instead of measuring a mutual capacitance at an intersection of a RX electrode and a TX electrode (a sense element) as done during mutual-capacitance sensing. An intersection between two sense elements may be understood as a location at which one sense electrode crosses over or overlaps another, while maintaining galvanic isolation from each other. The capacitance-sensing circuit 101 does not use mutual-capacitance or self-capacitance sensing to measure capacitances of the sense elements when performing a stylus sensing. Rather, the capacitance-sensing circuit 101 measures a charge that is capacitively coupled between the sense array 125 and the stylus as described herein. The capacitance associated with the intersection between a TX electrode and an RX electrode can be sensed by selecting every available combination of TX electrode and RX electrode. When a touch object, such as a finger or stylus, approaches the capacitive sense array 125, the object causes a decrease in mutual capacitance between some of the TX/RX electrodes. In another embodiment, the presence of a finger increases the coupling capacitance of the electrodes. Thus, the location of the finger on the capacitive sense array 125 can be determined by identifying the RX electrode having a decreased coupling capacitance between the RX electrode and the TX electrode to which the TX signal was applied at the time the decreased capacitance was measured on the RX electrode. Therefore, by sequentially determining the capacitances associated with the intersection of electrodes, the locations of one or more inputs can be determined. It should be noted that the process can calibrate the sense elements (intersections of RX and TX electrodes) by determining baselines for the sense elements. It should also be noted that interpolation may be used to detect finger position at better resolutions than the row/column pitch as would be appreciated by one of ordinary skill in the art having the benefit of this disclosure. In addition, various types of coordinate interpolation algorithms may be used to detect the center of the touch as would be appreciated by one of ordinary skill in the art having the benefit of this disclosure.

The capacitance-sensing circuit 101 includes the CSD Mutual Cap component 120. Additional details of the CSD Mutual Cap component 120 are described below with respect to FIGS. 2-14B.

In an embodiment, the electronic system 100 may also include non-capacitive sense elements 170 coupled to the processing device 110 via bus 171 and GPIO port 107. The non-capacitive sense elements 170 may include buttons, light emitting diodes ("LEDs"), and other user interface devices, such as a mouse, a keyboard, or other functional keys that do not use capacitance sensing. In one embodiment, buses 122, and 171 are embodied in a single bus. Alternatively, these buses may be configured into any combination of one or more separate buses.

Processing device 110 may include internal oscillator/clocks 106 and communication block ("COM") 108. In another embodiment, the processing device 110 includes a spread spectrum clock (not shown). The oscillator/clocks block 106 provides clock signals to one or more of the components of processing device 110. Communication block 108 may be used to communicate with an external component, such as a host processor 150, via host interface ("I/F") line 151. Alternatively, processing device 110 may also be coupled to embedded controller 160 to communicate with the external components, such as host processor 150. In one embodiment, the processing device 110 is configurable to communicate with the embedded controller 160 or the host processor 150 to send and/or receive data.

Processing device 110 may reside on a common carrier substrate such as, for example, an integrated circuit ("IC") die substrate, a multi-chip module substrate, or the like. Alternatively, the components of processing device 110 may be one or more separate integrated circuits and/or discrete components. In one exemplary embodiment, processing device 110 is the Programmable System on a Chip (PSoC®) processing device, developed by Cypress Semiconductor Corporation, San Jose, Calif. Alternatively, processing device 110 may be one or more other processing devices known by those of ordinary skill in the art, such as a microprocessor or central processing unit, a controller, special-purpose processor, digital signal processor ("DSP"), an application specific integrated circuit ("ASIC"), a field programmable gate array ("FPGA"), or the like.

It should also be noted that the embodiments described herein are not limited to having a configuration of a processing device coupled to a host, but may include a system that measures the capacitance on the sensing device and sends the raw data to a host computer where it is analyzed by an application. In effect, the processing that is done by processing device 110 may also be done in the host.

Capacitance-sensing circuit 101 may be integrated into the IC of the processing device 110, or alternatively, in a separate IC. Alternatively, descriptions of capacitance-sensing circuit 101 may be generated and compiled for incorporation into other integrated circuits. For example, behavioral level code describing the capacitance-sensing circuit 101, or portions thereof, may be generated using a hardware descriptive language, such as VHDL or Verilog, and stored to a machine-accessible medium (e.g., CD-ROM, hard disk, floppy disk, etc.). Furthermore, the behavioral level code can be compiled into register transfer level ("RTL") code, a netlist, or even a circuit layout and stored to a machine-accessible medium. The behavioral level code, the RTL code, the netlist, and the circuit layout may represent various levels of abstraction to describe capacitance-sensing circuit 101.

It should be noted that the components of electronic system 100 may include all the components described above. Alternatively, electronic system 100 may include some of the components described above.

In one embodiment, the electronic system 100 is used in a tablet computer. Alternatively, the electronic device may be used in other applications, such as a notebook computer, a mobile handset, a personal data assistant ("PDA"), a keyboard, a television, a remote control, a monitor, a handheld multi-media device, a handheld media (audio and/or video) player, a handheld gaming device, a signature input device for point of sale transactions, an eBook reader, global position system ("GPS") or a control panel. The embodiments described herein are not limited to touch screens or touch-sensor pads for notebook implementations, but can be used in other capacitive sensing implementations, for example, the sensing device may be a touch-sensor slider (not shown) or touch-sensor buttons (e.g., capacitance sensing buttons). In one embodiment, these sensing devices include one or more capacitive sensors or other types of capacitance-sensing circuitry. The operations described herein are not limited to notebook pointer operations, but can include other operations, such as lighting control (dimmer), volume control, graphic equalizer control, speed control, or other control operations requiring gradual or discrete adjustments. It should also be noted that these embodiments of capacitive sensing implementations may be used in conjunction with non-capacitive sensing elements, including but not limited to pick buttons, sliders (ex. display brightness and contrast), scroll-wheels, multi-media control (ex. volume, track advance, etc.) handwriting recognition, and numeric keypad operation.

Figure 2:
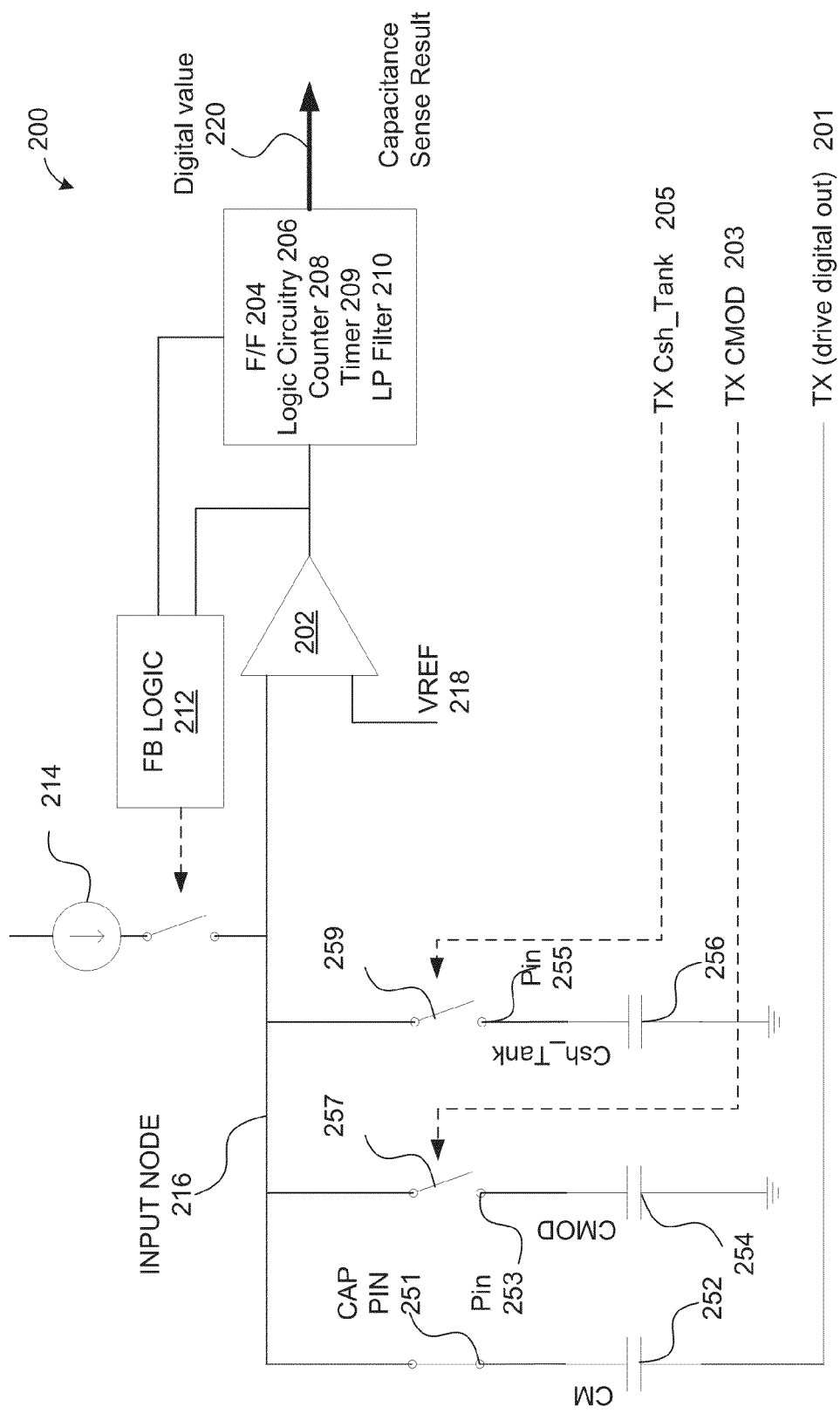
FIG. 2 is a circuit diagram illustrating a capacitance-sensing circuit comprising a CSD mutual capacitance component with two-capacitor integration according to one embodiment.

FIG. 2 is a circuit diagram illustrating a capacitance-sensing circuit 200 comprising a CSD mutual capacitance component with two-capacitor integration according to one embodiment. The capacitance-sensing circuit 200 includes a comparator 202, flip-flop 204, logic circuitry 206, counter 208, timer 209, low-pass filter 210, feedback logic 212, programmable current source 214, and an input node 216. The input node 216 is the node of an input to the sensing circuit, such as comparator 202 (also referred to as the sensing channel). In one embodiment, the input node is a node of an analog multiplexer bus (also referred to as AMUXBUSA). The input node 216 is coupled to a capacitance sense pin 251, which is coupled to a first electrode of a sense array. A transmit (TX) signal generation circuit (not illustrated) generates a TX signal 201 to drive a second electrode of the sense array. A mutual capacitance between the first electrode and the second electrode is represented as capacitor 252 (CM). An intersection between the first electrode and second electrode is also called a sensor. An intersection between two sense elements (electrodes) may be understood as a location at which one sense electrode crosses over or overlaps another, while maintaining galvanic isolation from each other. The capacitance-sensing circuit 200 also includes two capacitors for integration. One of the two capacitors is a modulator capacitor 254 (CMOD) capacitor. The CMOD capacitor 254 can be used for self-capacitance sensing by the CSD component in a self-capacitance sensing mode. CMOD capacitor 254 can also be used along with a second capacitor (Csh_Tank) 256 for mutual-capacitance sensing by the CSD component in a mutual-capacitance sensing mode. The Csh_Tank capacitor 256 can be used for mutual-capacitance sensing in the mutual-cap mode, as well as for shielding, waterproofing, proximity sensing or the like in other modes of operation. As described herein, the two capacitors CMOD capacitor 254, Csh_Tank capacitor 256 can be selectively coupled to the input node 216 for mutual-capacitance sensing. In particular, the logic circuitry 206 is configured to generate a first control signal TX CMOD 203 to selectively activate a first switch 257 coupled between the CMOD capacitor 254 and the input node 216. The logic circuitry 206 also is configured to generate a second control signal TX Csh_Tank 205 to selectively activate a second switch 259 coupled between the Csh_Tank capacitor 256 and the input node 216. The other terminals of the CMOD capacitor 254 and Csh_Tank capacitor 256 are coupled to ground. The logic circuitry 206 may selectively activate the first switch 257 and second switch 259 in a non-overlapping manner. In one embodiment, the CMOD capacitor 254 and the Csh_Tank capacitor 256 are external to an integrated circuit die upon which the capacitance-sensing circuit 200 is disposed.

In one embodiment where external capacitors are used, the first capacitor, CMOD capacitor 254, is coupled to a first pin 253 and the second capacitor, Csh_Tank capacitor 256, is coupled to a second pin 255. The first pin 253 and second pin 255 may be general-purpose input-output (GPIO) pins of the processing device 110. As described herein, the CMOD capacitor 254 and Csh_Tank capacitor 256 operate to store the RX signal on input node 216 and retain an error from cycle to cycle of the TX signal 201. In one embodiment, the logic circuitry 206 is configured to selectively couple the CMOD capacitor 254 to the input node 216 in a non-overlapping manner and timed to capture the RX signal from a first edge (e.g., rising edge) of the TX signal 201. The logic circuitry 206 is configured to selectively couple the Csh_Tank capacitor 256 to the input node 216 in a non-overlapping manner and timed to capture the RX signal from a second edge (e.g., falling edge) of the TX signal 201. In one embodiment, the CMOD capacitor 254 and Csh_Tank capacitor 256 are the same size. In another embodiment, the capacitors are similar in size, such as within 10% smaller or larger than one another. It should also be noted that minor differences in the size of the capacitors and programmable current sources can be negligible. For example, these differences may result into mismatched values of the current sink counts and current source counts, and calibration routines can be used to compensate for these minor differences. The mismatches are permissible so long as the input node voltage (e.g., AMUXBUSA voltage) crosses Vref during each half TX cycle.

In this embodiment, the CSD mutual cap component 120, described in FIG. 1, is an analog-to-digital converter (ADC) that measures a RX signal on the input node 216 and converts the RX signal into a digital value 220. The digital value 220 represents a mutual capacitance between the first electrode and the second electrode, CM 252. Digital value 220 is the capacitance sense result. The digital value 220 can be further processed by the processing device 110, or host 150.

In the depicted embodiment, the ADC includes the comparator 202, flip-flop 204, counter 208, and timer 209. The comparator 202 is coupled to the input node 216 and a voltage reference (Vref) 218. The comparator 202 receives an RX signal on the input node 216. The comparator 202 toggles when the RX signal crosses the voltage reference 218. The flip-flop 204 (or other sample and hold circuit) is coupled to the output of the comparator 202 to sample the output of the comparator 202. The timer 209 is configured to reset the ADC after a time period and the counter is coupled to the output of the flip-flop 204 to count a number of times the RX signal crosses the Vref 218 during the time period. A counter value of the counter 208, prior to the reset, represents the digital value 220 of the mutual capacitance between the first electrode and the second electrode (e.g., CM 252).

Feedback logic 212 is coupled to the output of the comparator 202 and the logic circuitry 206. The feedback logic 212 is configured to control the programmable current source 214. In one embodiment, the programmable current source is a single programmable current source that can be configured to operate as a current source or a current sink. For example, the programmable current source can be configured as a current source to the input node 216 during a positive portion of a TX cycle of the TX signal 201 and as a current sink to the input node 216 during a negative portion of the TX cycle. In another embodiment, the programmable current source 214 includes two separate programmable current sources, one programmable current source is configured as a current source and the other programmable current source is configured as a current sink. For example, the first programmable current source is configured to source current on the input node 216 during a positive portion of a TX cycle of the TX signal 201 and the second programmable current source is configured to sink current on the input node 216 during a negative portion of the TX cycle.

In one embodiment, the external capacitors are used by the CSD component for self-capacitance sensing and waterproofing in different modes of operation; during the mutual-capacitance sensing mode these external capacitors are used for integration of the TX cycle for mutual capacitance sensing. The difference between these modes is that the external capacitors are intermittently connected to the input node 216 timed with the TX signal to a sense pin in order to measure a mutual capacitance of a sensor (intersection of a TX electrode and a RX electrode).

Figure 3:
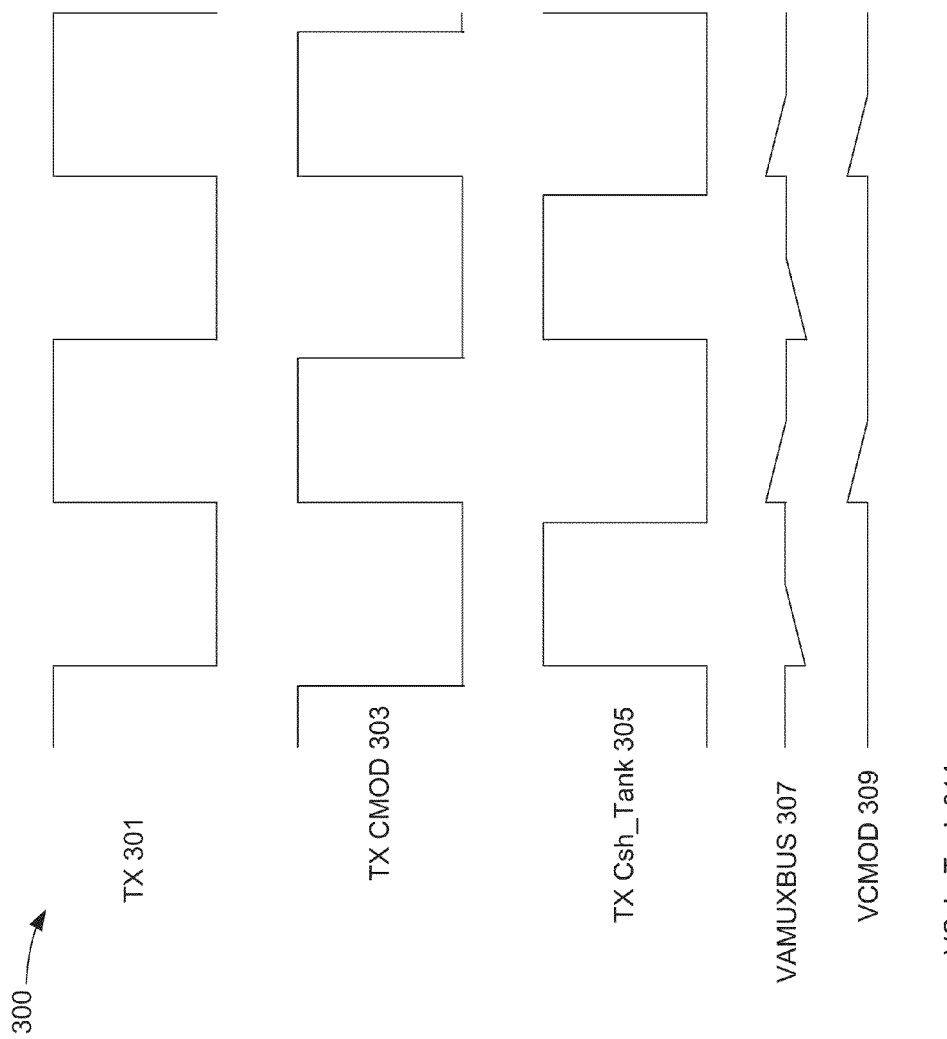
FIG. 3 is a diagram illustrating the mutual-capacitance sensing waveforms of the capacitance-sensing circuit of FIG. 2 according to one embodiment.

FIG. 3 is a diagram 300 illustrating the mutual-capacitance sensing waveforms of the capacitance-sensing circuit of FIG. 2 according to one embodiment. The TX signal 301 is a square-wave signal. The TX CMOD 303 is the first control signal to activate the first switch to couple the CMOD capacitor 254 to the input node 216 and TX Csh_Tank 305 is the second control signal to activate the second switch to couple the Csh_Tank capacitor 256 to the input node 216. The signal VAMUXBUS signal 307 represents the voltage on the input node 216 as seen at the sensing channel of the ADC (e.g., comparator 202). The VCMOD signal 309 represents the voltage on the CMOD capacitor 254 and VCsh_Tank signal 311 represents the voltage on the Csh_Tank capacitor 256. FIG. 3 illustrate the waveforms 303, 305 driving the switches and the resulting waveforms 307, 309, 311 on the capacitors 254, 256 and the input node 216. The control signals 303 (TX CMOD) and 305 (TX Csh_Tank) are non-overlapping and are timed to capture the rising and falling events from the TX signal 301.

Figure 4:
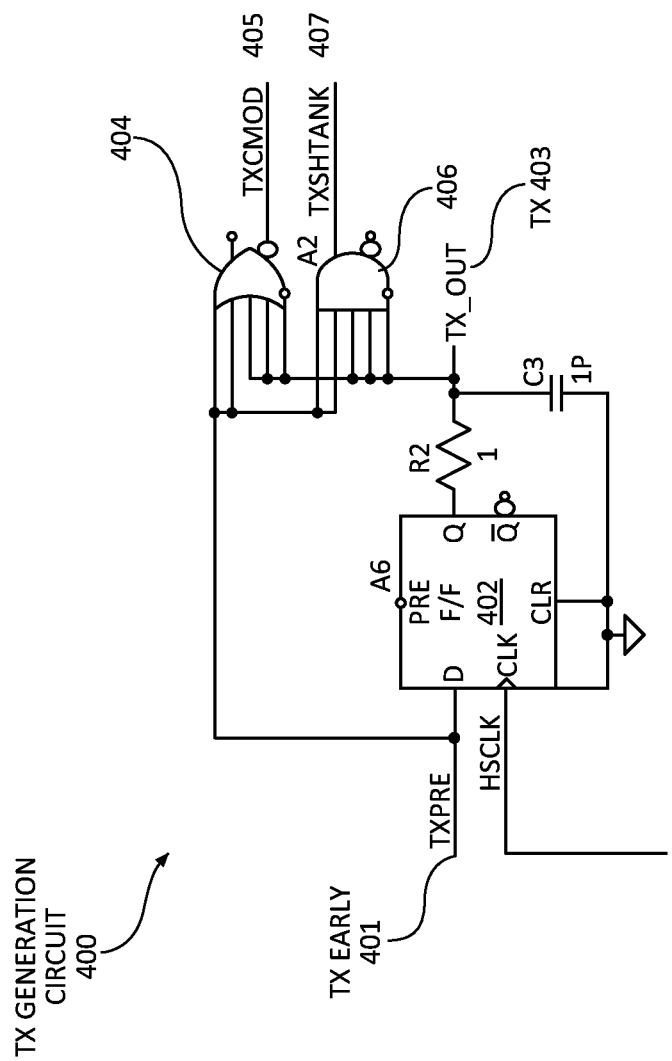
FIG. 4 is a circuit diagram illustrating a transmit (TX) signal generation circuit according to one embodiment.

FIG. 4 is a circuit diagram illustrating a transmit (TX) signal generation circuit 400 according to one embodiment. The TX signal generation circuit 400 includes a flip-flop 402 that receive a TX early signal 401 (txpre) at an input and outputs the TX signal 403. The flip-flop 402 operates to delay the TX signal 403 from the TX early signal 401. The TX signal generation circuit 400 also includes logic to generate the control signals 405 and 407 used to control the switches coupled to the two capacitors, CMOD capacitor and Csh_Tank capacitor as described above. In particular, a NOR gate 404 is coupled to receive the TX early signal 401 and the TX signal 403 and to output a first control signal 405 to selectively couple the first capacitor to the input node. A AND gate 406 is coupled to receive the TX early signal 401 and the TX signal 403 and to output a second control signal 407 to selectively couple the second capacitor to the input node. In other embodiments, other logic can be used to generate the control signals 405 and 407 based on the TX signal. The TX signal generation circuit 400 may include other components like a resistor and a capacitor as a low-pass filter at the output of the flip-flop 402. The low-pass filter may be used to filter the output, as well as introduce a given delay between the TX early signal 401 and the TX signal 403. The logic delays can be used to ensure that the capacitor switches are closing at or before the time at which the TX voltage reaches the sense array.

Figure 5:
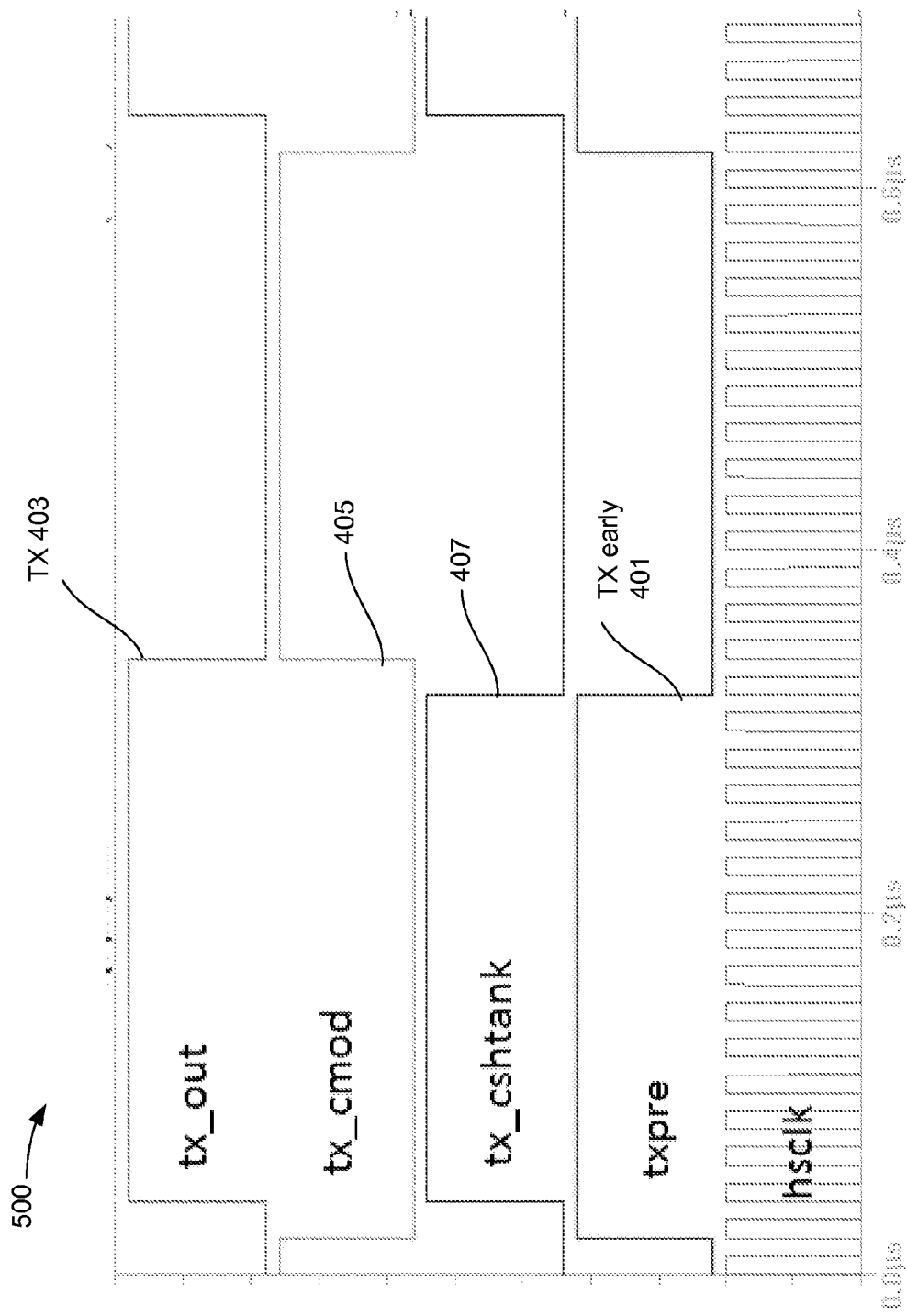
FIG. 5 is a diagram illustrating waveforms of the TX signal generation circuit of FIG. 4 according to an embodiment.

FIG. 5 is a diagram 500 illustrating waveforms of the TX signal generation circuit of FIG. 4 according to an embodiment. The TX signal 403, which is a delayed version of TX early 401, is a rectangular signal within a TX cycle. The voltage at the input node crosses Vref on each half TX cycle. At the rising edge of the TX signal 403, the second control signal 407 is activated to turn on the second switch for the second capacitor, Csh_Tank capacitor. At the falling edge of the TX signal 403, the first control signal 405 is activated to turn on the first switch for the first capacitor, CMOD capacitor. The switches controlled by control signals 405 and 407 are switched in a non-overlapping manner to intermittently couple the CMOD capacitor and Csh_Tank capacitor to the input node during the full TX cycle. As described herein, the CMOD capacitor and Csh_Tank capacitor can retain the error from cycle to cycle of the TX signal.

Figure 6:
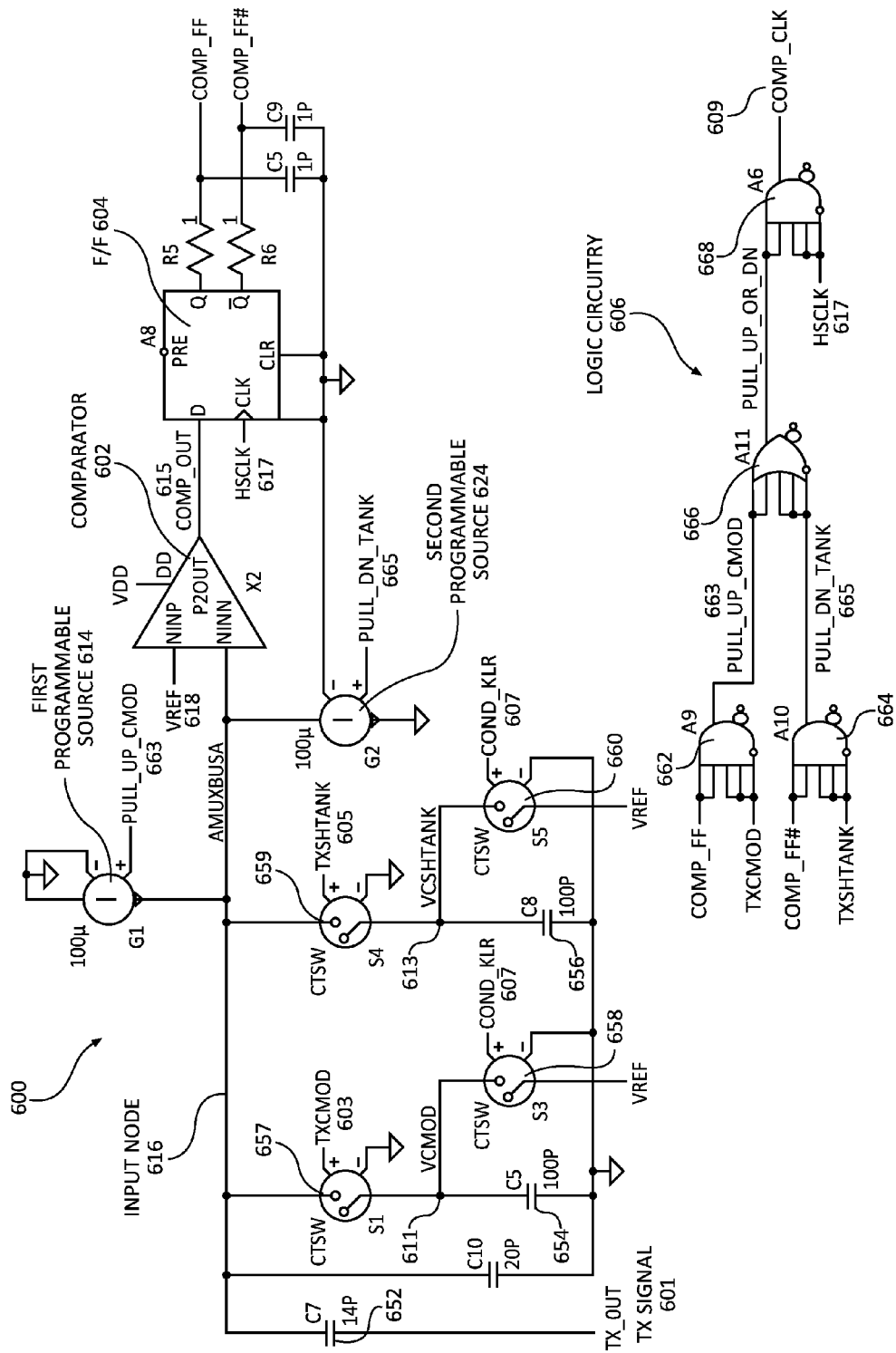
FIG. 6 is a circuit diagram illustrating an analog section of the capacitance-sensing circuit according to one embodiment.

FIG. 6 is a circuit diagram illustrating an analog section 600 of the capacitance-sensing circuit according to one embodiment. The analog section 600 includes analog multiplexer (AMUX) bus 616, first programmable current source 614, second programmable current source 624, comparator 604, flip-flop 604, logic circuitry 606, first switch 657, second switch 659, first capacitor 654, and second capacitor 656.

Figure 7:
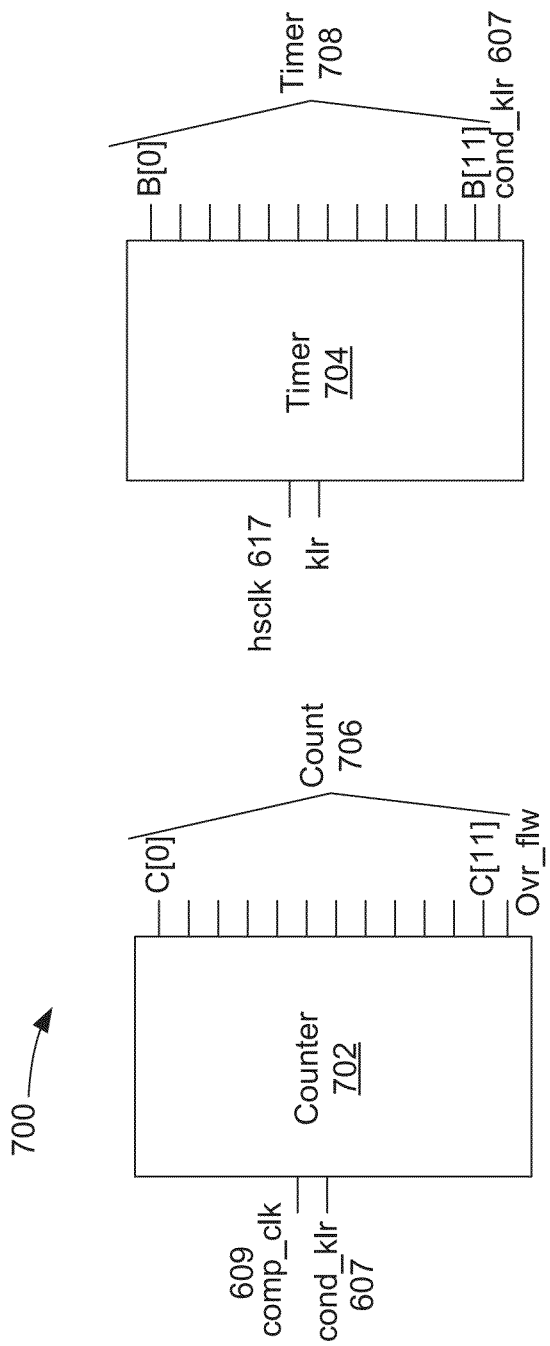
FIG. 7 is a circuit diagram illustrating a digital section and a signal generation section of the capacitance-sensing circuit according to one embodiment.

The input node 616 is coupled to a capacitance sense pin, which is coupled to a first electrode (RX electrode) of a sense array. A transmit (TX) signal generation circuit (illustrated in FIG. 7) generates a TX signal 601 to drive a second electrode (TX electrode) of the sense array. A mutual capacitance between the first electrode and the second electrode is represented as capacitor 652 (also called an intersection or a sensor). The first capacitor 654 is selectively coupled to the input node 616 by the first switch 657, which is controlled by a first control signal 603 (txcmod). The second capacitor 656 is selectively coupled to the input node 616 by the second switch 659, which is controlled by a second control signal 605 (txshtank). The analog section 600 may also include a third switch 658, which is controlled by a reset signal 607 (cond_klr) to selectively couple the first capacitor 654 to reset the first capacitor 654 to Vref 618. The analog section 600 may also include a fourth switch 660, which is controlled by the reset signal 607 (cond_klr) to selectively couple the second capacitor 656 to reset the second capacitor 656 to Vref 618. As described herein, the first capacitor 654 and second capacitor 656 can be selectively coupled to the input node 616 for mutual-capacitance sensing. The first capacitor 654 can be also used for self-capacitance in the self-capacitance sensing mode. The second capacitor 256 can also be used for shielding, waterproofing, proximity sensing, or the like in other modes of operation. In one embodiment, the first capacitor 654 and the second capacitor 656 are external to an integrated circuit die upon which the analog section 600 is disposed. The first capacitor 654 and second capacitor 656 operate to store the RX signal on input node 616 and retain an error from cycle to cycle of the TX signal 601. Logic circuitry, described with respect to FIG. 7, is configured to selectively couple the first capacitor 654 to the input node 616 in a non-overlapping manner and timed to capture the RX signal from a first edge (e.g., rising edge) of the TX signal 601. The logic circuitry is configured to selectively couple the second capacitor 656 to the input node 616 in a non-overlapping manner and timed to capture the RX signal from a second edge (e.g., falling edge) of the TX signal 601. In one embodiment, the first capacitor 654 and second capacitor 656 are the same size or similar sizes (e.g., 10% difference). In one embodiment, the first capacitor 654 and second capacitor 656 are 100 pF capacitors.

The analog section includes an ADC comprising the comparator 602 coupled to the input node 616 and a voltage reference (Vref) 618. The comparator 602 receives an RX signal on the input node 616 and toggles when the RX signal crosses the voltage reference 618. The flip-flop 604 is coupled to the output 615 of the comparator 602 to sample the output 615.

Logic circuitry 606 is feedback logic that is coupled to the output of the flip-flop 604, as well as the control signals 603, 605. The logic circuitry 606 generates control signals for the programmable current sources 614, 624. In one embodiment, the programmable current sources 614, 624 source or sink 100 uA current to the input node 616. Separate sink and source current sources may be used for the positive and negative portions of the TX cycle. The TX signal 601 may be 1 Vpp, and the mutual capacitance 652 may be varied between 1 pF and 20 pF. It should be noted that the capacitance sense pin, which is used to sense mutual capacitance 652 may have a parasitic capacitance, such as 20 pF. Alternatively, other capacitance values, voltages, and currents may be used. In particular, a first gate 662 receives the output of the flip-flop 604 and the first control signal 603 to generate a pull-up signal 663 for the first programmable source 614 to current source the first capacitor 654. A second gate 664 receives an inverted output of the flip-flop 604 and the second control signal 605 to generate a pull-down signal 665 for the second programmable source 624 to current sink the second capacitor 656. In a further embodiment, the first programmable current source 614 is configured to source current on the input node 616 during a positive portion of a TX cycle of the TX signal 601 and the second programmable current source 624 is configured to sink current on the input node 616 during a negative portion of the TX cycle. The logic circuitry 606 may further include a third gate 666 to indicate when the programmable current sources 614, 624 are activated (turned on), and a fourth gate 668 with the output of the third gate 666 as an input with a clock signal. The output 609 of the fourth gate 668 is the comparator's clock that can be input into a counter as described below. In one embodiment, the TX signal is 200 KHz and the clock signal (hsclk) is 50 MHz. Alternatively, other frequencies may be used for the TX signal and the clock signal.

FIG. 7 is a circuit diagram illustrating a digital section 700 and a signal generation section 750 of the capacitance-sensing circuit according to one embodiment. The digital section 700 includes a counter 702 and a timer 704. The output 609 of the logic circuitry 606 of FIG. 6 is input into the counter. The counter 702 counts while the programmable current sources 614, 624 are active. The timer 704 is configured to resets the counter 702, as well as the first capacitor 654 and second capacitor 656 after a time period. The timer 704 outputs a timer counter 708 and a reset signal 607 (cond_klr) when a maximum number of the timer 704. The reset signal 607 can be used to reset the counter 702. The reset signal 607 can also be used to discharge a first voltage at a first node 611 coupled to a terminal of the first capacitor 654 and a second voltage at a second node 613 coupled to a terminal of the second capacitor 656. A counter value 706 of the counter 702, just prior to reset 607, represents the digital value of the mutual capacitance between the first electrode and the second electrode (e.g., capacitor 652). The digital value can be further processed by the processing device 110, or host 150.

Figure 8:
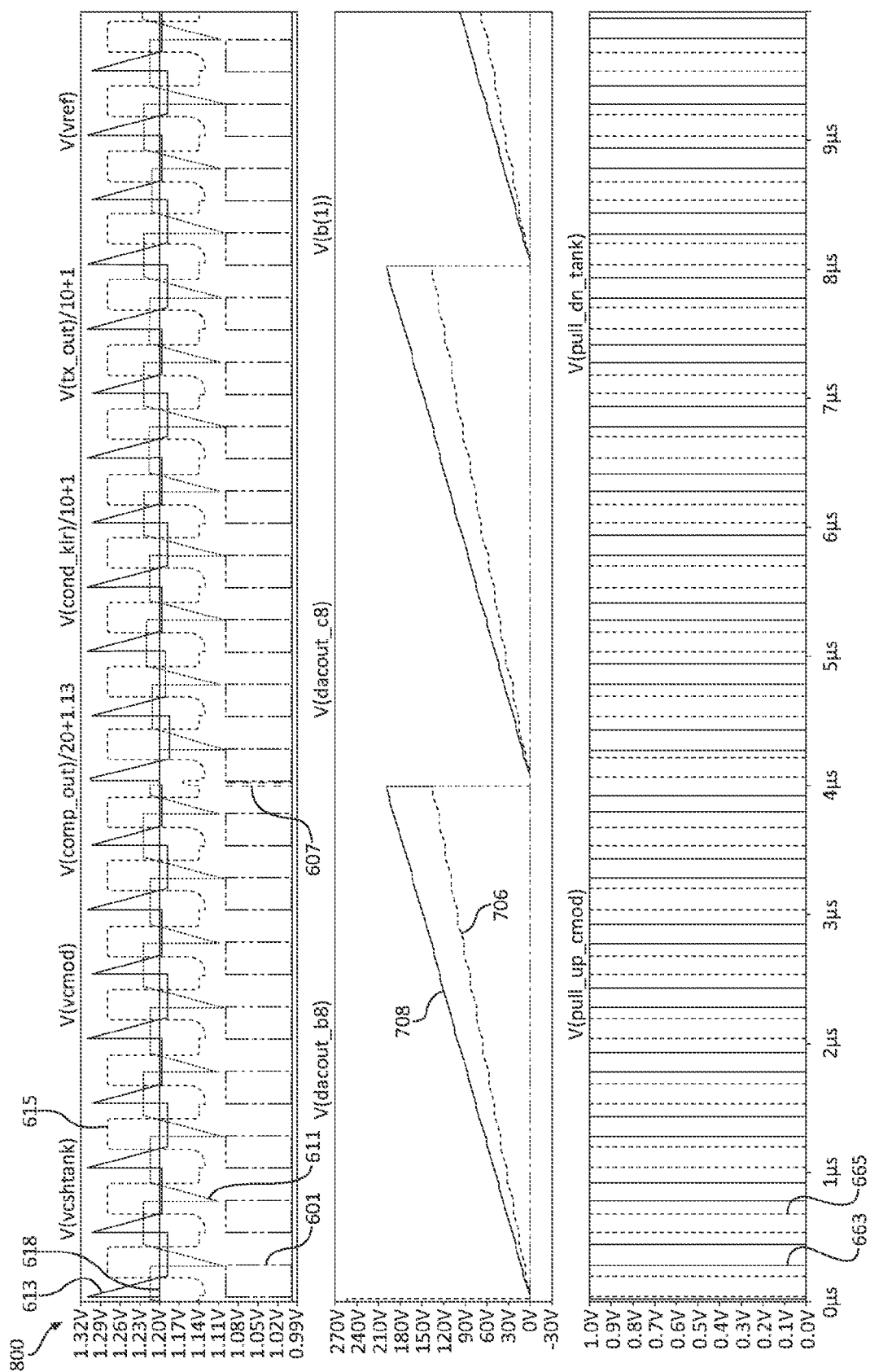
FIG. 8 is a diagram illustrating waveforms of the capacitance-sensing circuit of FIGS. 6-7 according to one embodiment.

The first switch 657 (switch S1) and second switch 659 (switch S4) are used to connect the first capacitor 654 and second capacitor 656, respectively to input node 616 in a non-overlapping manner, controlled by the first control signal 603 (txcmod) and second control signal 605 (txshtank). At the beginning of each TX cycle, third switch 658 (switch S3) and fourth switch (660 (switch S5) initialize the first capacitor 654 and second capacitor 656 to Vref 618. As illustrated in FIG. 8, the digital timer measures 200 time periods and resets the circuit during each cycle. The counter value 706 just prior to reset 607 represents the value of the mutual capacitance.

Each TX pulse edge applies a charge to the input node 616 and either first capacitor or second capacitor as controlled by the switches. The charge on the input node 616 is compensated for by the sink/source current sources (programmable current sources 614, 624). The current sources 614, 624 are controlled by the flip-flop outputs combined with the first control signal 603 (txcmod) and second control signal 605 (txshtank). The current sources 614, 624 (pull-up and pull-down), and the capacitors (CMOD and Csh_tank) should be approximately the same, however minor mismatches may be compensated for or ignored. After each transition, the voltage of the input node 616 should cross the Vref 618. In one embodiment, a calibration routine can be run to adjust the programmable current sources 614, 624. For example, if the current is too small, then the mutual capacitance value diverges away from Vref 618, and the maximum count value is output. The full scale counter output 706 may be less than the timer value 708 because of the non-overlapping time.

FIG. 8 is a diagram 800 illustrating waveforms of the capacitance-sensing circuit of FIGS. 6-7 according to one embodiment. FIG. 8 shows a simulation of the circuit for 10 us. In particular, the diagram illustrates the signals 611, 613, 615, 607, 601, 618, 708, 706, 663, and 665 of FIGS. 6-7.

FIG. 8 shows a top-level simulation result in which the top window shows the analog waveforms for the second capacitor (Csh_tank), first capacitor (CMOD), Vref, and an attenuated comparator result. In one embodiment, the comparator is a two-stage NMOS input compensated by a transistor amplifier. The attenuated reset signal (comp_klr) and TX signal (tx_out) in the top window. The center window in FIG. 8 contains the timer and counter values. When the timer reaches 200 counts the reset signal 607 (comp_klr) resets the timer and counter. The reset signal 607 (comp_klr) also resets the CMOD and Csh_tank capacitors to Vref. The lower window shows the pull-up signal (pull_up_cmod) and pull-down signal (pull_dn_tank), which control the current sources.

The counter value is represented by the smaller analog ramp in FIG. 8. The ramp value in volts directly matches the counter value. The counter values at 4 us and 8 us were averaged over two cycles for various mutual capacitance values. The mutual capacitance values were varied from 12-20 pF. However the TX pulse amplitude was only 1Vpp. If the TX pulse amplitude was 5V, this would equate to mutual capacitance values of ⅕th of what are described.

Figure 9:
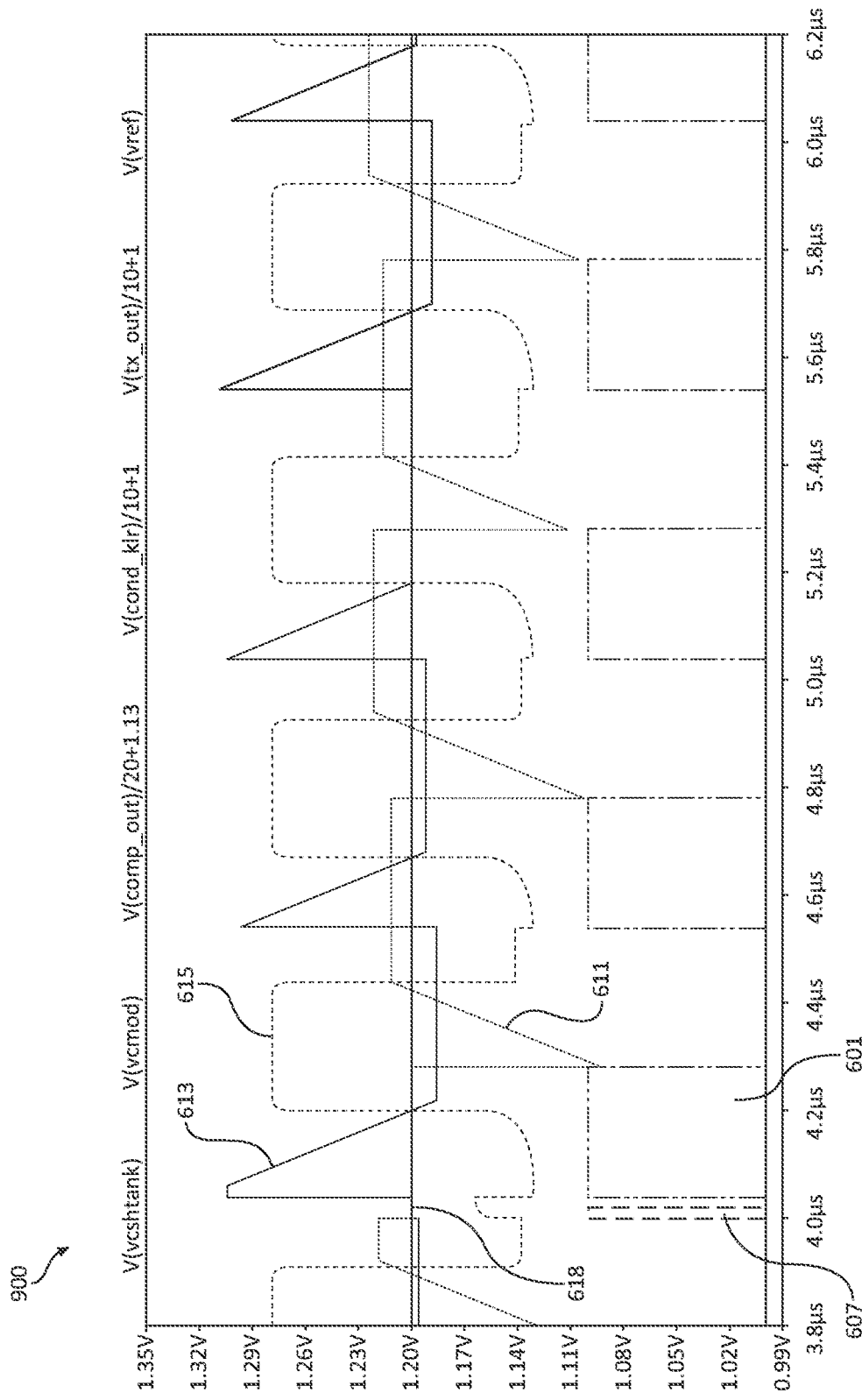
FIG. 9 is a diagram illustrating analog waveforms of the analog section of the capacitance-sensing circuit according to one embodiment.
Figure 10:
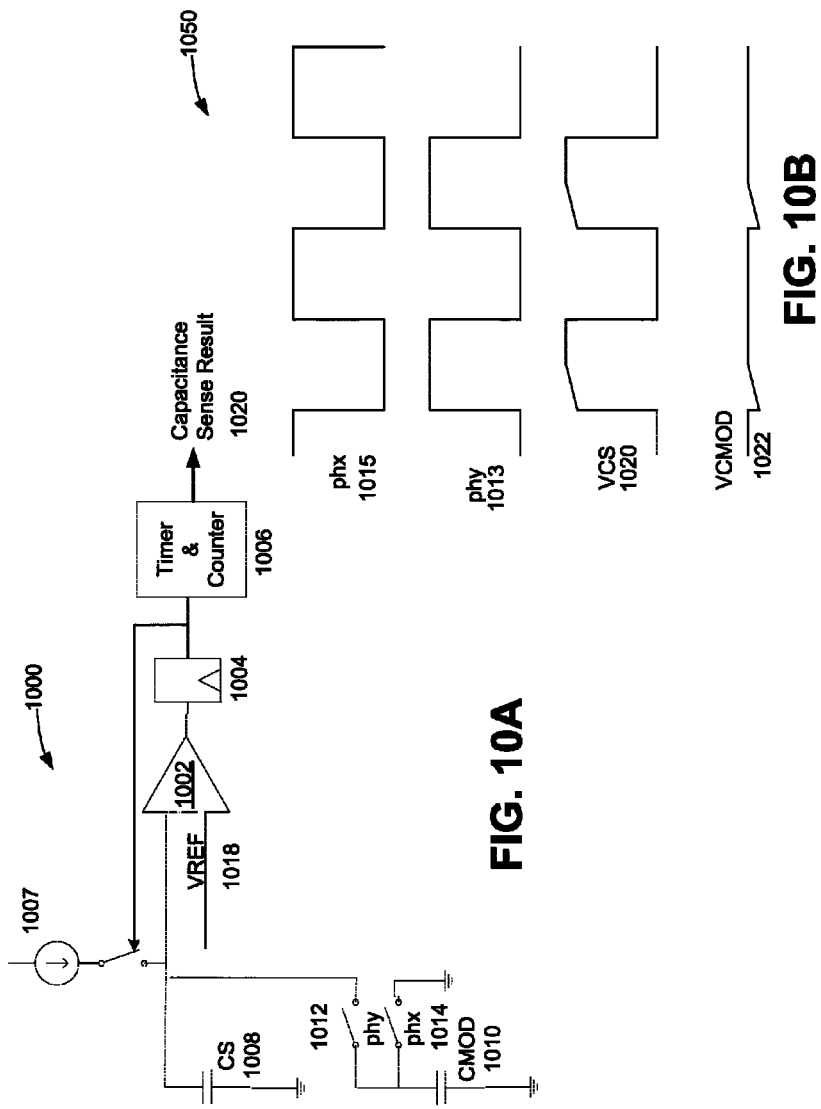
FIG. 10A is a circuit diagram illustrating a capacitance-sensing circuit for self-capacitance sensing in a self-capacitance sensing mode according to one embodiment.
FIG. 10B is a diagram illustrating waveforms of the capacitance-sensing circuit of FIG. 10A according to one embodiment.
Figure 11:
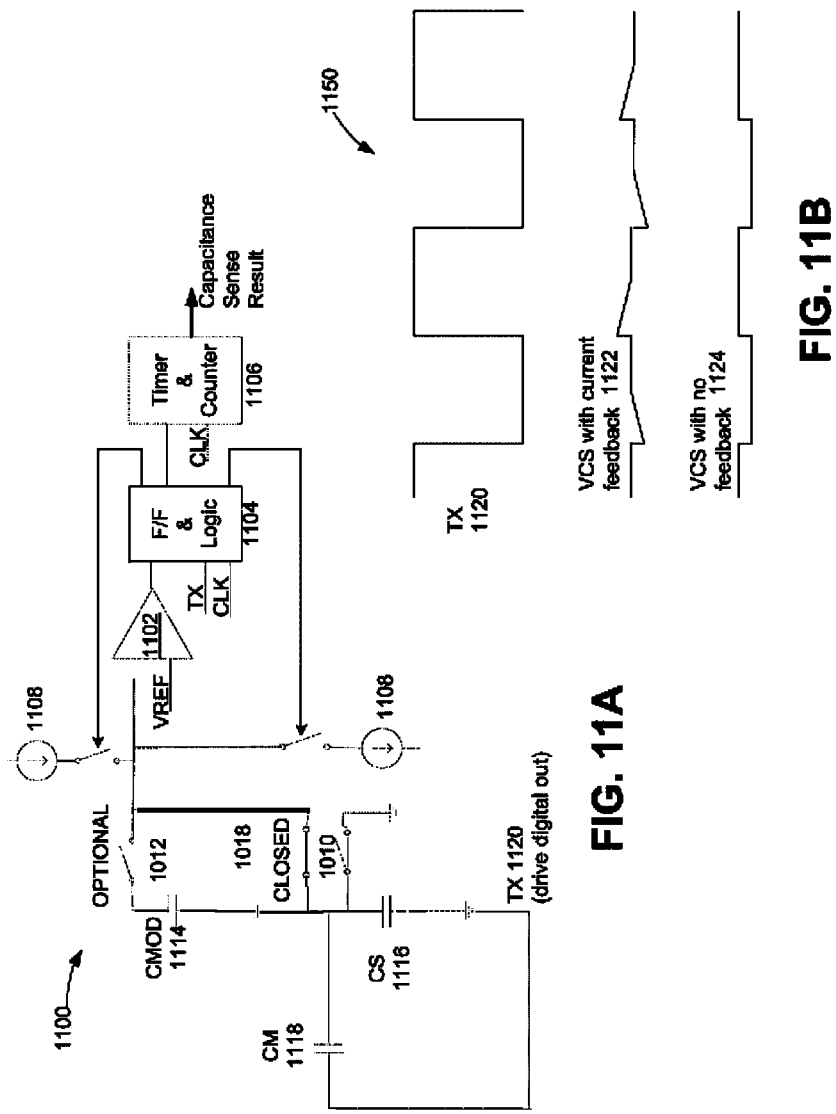
FIG. 11A is a circuit diagram illustrating a capacitance-sensing circuit for mutual-capacitance sensing according to another embodiment.
FIG. 11B is a diagram illustrating waveforms of the capacitance-sensing circuit of FIG. 11A according to one embodiment.
Figure 12:
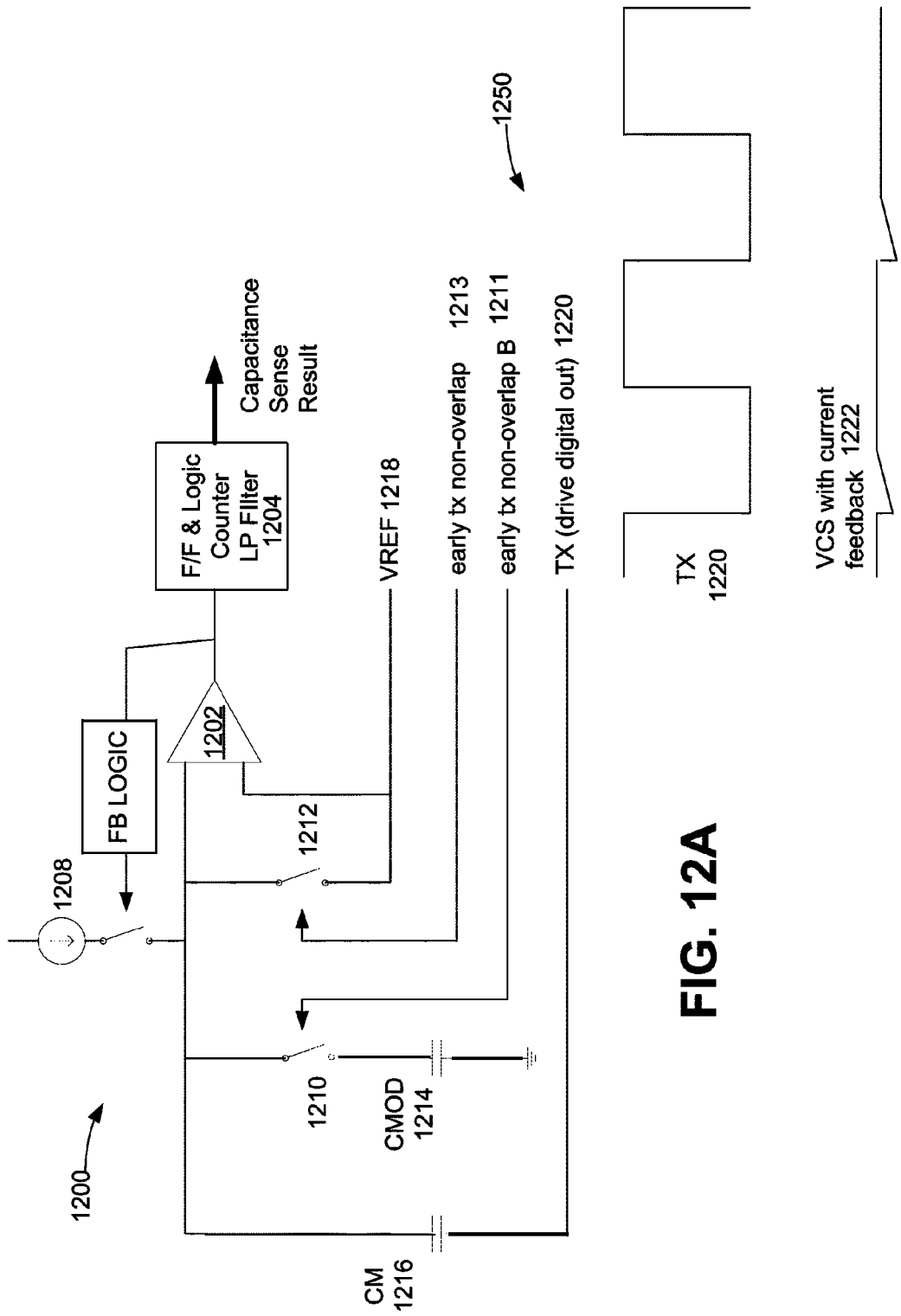
FIG. 12A is a circuit diagram illustrating a capacitance-sensing circuit for half-wave mutual-capacitance sensing according to another embodiment.
FIG. 12B is a diagram illustrating waveforms of the capacitance-sensing circuit of FIG. 12A according to one embodiment.

FIG. 9 is a diagram 900 illustrating analog waveforms of the analog section of the capacitance-sensing circuit according to one embodiment. The diagram 900 is a close-up view of the signals 601, 607, 611, 613, 615, and 618.

FIG. 9 zooms in on the analog waveform section at the time around 4 us when the first reset occurs. The Vref node is shown constant at 1.2V. The second control signal 605 (csh-tank) node goes up at each rising TX edge, and the first control signal 603 (cmod) node voltage goes down at each falling TX edge. The current does not start until the comparator output (flip-flop delayed) and the control signal states (txcmod or txshtank states) are correct. The comparator delay plus flip flop delays are shown in this waveform. The maximum TX clock frequency for this application is probably only a 200-300 kHz. The maximum frequency may be limited by the high-speed clock (hsclk) frequency. The hsclk frequency should be as fast as possible in the system to minimize errors. This also applies to normal CSD operation to avoid flat spots in the transfer function.

Table 1 below summarizes the simulation results for various mutual capacitance (Cmutual) values. The simulations were run with Cmod=Csh_Tank=100 pF, and with the currents set for 100 uA. The current DAC values are related to the mutual capacitance value. The amplitude of the AMUX-BUSA signals (e.g., input node 616) is related to the TX pulse amplitude, the mutual capacitance value as represented by the number of counts, and the value of Cmod/Csh_Tank. Larger amplitude signals on the input node may result in better signal-to-noise ratio; this may be due to limited comparator performance. The comparator has finite gain and delays that are related to signal amplitude.

TABLE 1

Mutual sensing results
timer set for 200 counts, Cmod = Csh_Tank = 100 pF

| Cmutual | Counts1 | counts2 | avg | delta | counts/pF |
|---|---|---|---|---|---|
| 20 pf | 183 | 185 | 184 | | |
| 19 pf | 175 | 177 | 176 | 8 | 8 |
| 18 pf | 167 | 169 | 168 | 8 | 8 |
| 16 pf | 151 | 153 | 152 | 16 | 8 |
| 14 pf | 135 | 137 | 136 | 16 | 8 |
| 12 pf | 119 | 121 | 120 | 16 | 8 |

The simulation results above show that the simulation results were a constant 8 counts/pF from 12-20 pF. This corresponds to a sensitivity of 40 counts per pF if the system is stimulated with a 5V TX pulse. This sensitivity is only for a timer of 200 counts. If the timer is doubled, then the sensitivity will be doubled also, for example.

Synchronizing the TX and system signals, decreasing the Cmod capacitance, and increasing the timer value are methods that are known and need to be implemented with the CSD mutual cap component described herein. These methods can be easily implemented in digital, whether in a UDB or PNR logic depends on the chip.

This shows that reasonable results can be obtained in as little as 10 us with resolutions of $\frac{1}{40}^{th}$ of a pF with the CSD mutual cap component described herein.

FIG. 10A is a circuit diagram illustrating a capacitance-sensing circuit 1000 for self-capacitance sensing in a self-capacitance sensing mode according to one embodiment. In this embodiment, the capacitance-sensing circuit 1000 includes a comparator 1002, flip-flop 1104, timer and counter 1006, and a programmable current source 1007, switches 1012, 1014, and a capacitor 1010 (CMOD). The programmable current source 1007 charges the analog multiplexer (AMUX) bus that is coupled to a sense element via a capacitance sense pin, represented as CS capacitor 1008. The comparator 1002 compares a signal on the input node against a voltage reference 1018. The output of the comparator is sampled by the flip-flop 1004 and the output of the flip-flop 1004 is used to control a switch to selectively couple the programmable current source 1007 to the input node. The number of times the signal at the comparator 1002 crosses the voltage reference 1018 is counted by the timer and counter 1006 to convert the signal to a digital value 1020. The switches 1012 are selectively activated in a non-overlapping manner to charge and discharge capacitor CMOD 1010.

FIG. 10B is a diagram 1050 illustrating waveforms of the capacitance-sensing circuit of FIG. 10A according to one embodiment. The diagram 1050 shows the phase signals 1013, 1015 that control the switches 1012, 1014, respectively. The diagram 1050 also shows the voltage 1020 (VCS) at the sense element, CS capacitor 1008 and the voltage 1022 at the capacitor CMOD 1010.

Described below are other alternative embodiments for modifying the CSD mutual cap component for mutual capacitance sensing.

FIG. 11A is a circuit diagram illustrating a capacitance-sensing circuit 1100 for mutual-capacitance sensing according to another embodiment. In this embodiment, the capacitance-sensing circuit 1100 includes a comparator 1102, flip-flop and other logic 1104, timer and counter 1106, programmable current sources 1108, and switches 1110. The capacitance-sensing circuit 1100 may also include an optional switch 1112 that switches in a modulator capacitor 1114 (CMOD). A TX signal 1120 is applied to a first electrode and received as a RX signal on a second electrode. The mutual capacitance at the intersection between the first and second electrodes is represented as capacitor CM 1118. The capacitor CS 1116 represents the self-capacitance of the second electrode. The switches 1010 are used to charge and transfer the voltage at the VCS node and to discharge the second electrode to ground. The programmable current sources 1108 can be used as current source or current sink to the input node that is input into the comparator 1102.

FIG. 11B is a diagram 1150 illustrating waveforms of the capacitance-sensing circuit of FIG. 11A according to one embodiment. The diagram 1150 shows the TX signal 1120, as well as the VCS voltage 1122 with current feedback and the VCS voltage 1124 with no feedback.

One potential problem with this circuit 1100 is that the circuit accumulates errors on each cycle that are due to limited comparator gain, comparator delay, and F/F delay. The errors may be reduced by using a half-wave mutual CSD sensing architecture illustrated in FIG. 12A.

FIG. 12A is a circuit diagram illustrating a capacitance-sensing circuit 1200 for half-wave mutual-capacitance sensing according to another embodiment. In this embodiment, the capacitance-sensing circuit 1200 includes a comparator 1202, flip-flop, logic, counter, LP filter 1204, programmable current source 1208, switches 1210, 1212, and a modulator capacitor 1214 (CMOD). A TX signal 1220 is applied to a first electrode and received as a RX signal on a second electrode. The mutual capacitance at the intersection between the first and second electrodes is represented as capacitor CM 1216. The switches 1210 and 1212 are controlled by non-overlapping signals (early TX signal) 1211 and 1213, respectively. The switch 1210, as controlled by signal 1211, selectively couples the CMOD capacitor 1214 to the input node coupled to the input of the comparator 1202. The switch 112, as controlled by signal 1213, selectively couples the input node to VRef 1218 to reset the voltage to Vref 1218. The programmable current sources 1208 can be used as current source to the input node.

FIG. 12B is a diagram 1250 illustrating waveforms of the capacitance-sensing circuit of FIG. 12A according to one embodiment. The diagram 1250 shows the TX signal 1220, as well as the VCS voltage 1222 with current feedback. Simulations indicate that a five times SNR improvement could be achieved with the circuit 1200. However, this method may reduce the effective signal by half and may be more sensitive to low-frequency noise.

The embodiments described above that use two capacitors as on-chip or off-chip integrators can provide a better mutual-capacitance sensing than the circuits 1100, 1200. One capacitor captures the signal from the rising edge, and the other from the falling edge. Furthermore, the GPIO pads could be controlled to switch between the two capacitors, CMOD and Csh_Tank capacitors. Applications that use equal values for CMOD and Csh_Tank could use these capacitors for mutual sensing.

Figure 13:
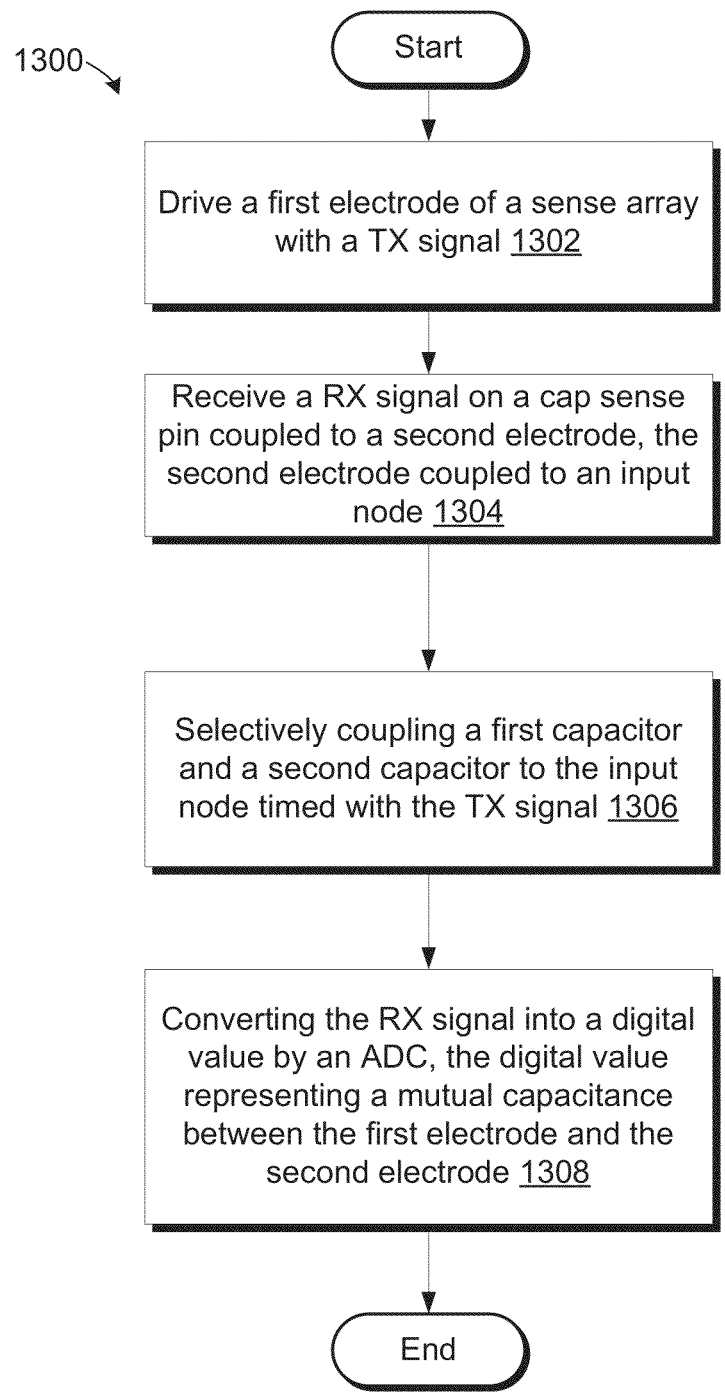
FIG. 13 is a flow diagram of a method of mutual-capacitance sensing with a CSD mutual cap component according to an embodiment.

FIG. 13 is a flow diagram of a method 1300 of mutual-capacitance sensing with a CSD mutual cap component according to an embodiment. The method 1300 may be performed by processing logic that may comprise hardware (circuitry, dedicated logic, etc.), software (such as is run on a general purpose computing system or a dedicated machine), firmware (embedded software), or any combination thereof. In one embodiment, the processing device 110 performs the method 1300. In another embodiment, the CSD Mutual Cap component 120 performs the method 1300. Alternatively, other components of the electronic system 100 perform some or all of the operations of method 1300.

Referring to FIG. 13, the method 1300 begins with processing logic driving a first electrode of a sense array with a transmit (TX) signal by a capacitance-sensing circuit (block 1302). The processing logic receives a receive (RX) signal on a capacitance sense pin coupled to a second electrode of the sense array (block 1304). The capacitance sense pin is coupled to an input node. The processing logic selectively couples a first capacitor to the input node and a second capacitor to the input node timed with the TX signal (block 1306). The processing logic converts the RX signal into a digital value by an analog-to-digital converter (ADC) of the capacitance-sensing circuit (block 1308). The digital value represents a mutual capacitance between the first electrode and the second electrode.

In a further embodiment, the processing logic at block 1306, selectively activates a first switch coupled between the input node and the first capacitor to selectively couple the first capacitor to the input node and selectively activates a second switch coupled between the input node and the second capacitor to selectively couple the second capacitor to the input node. In one embodiment, the first capacitor and the second capacitor are external to an integrated circuit die upon which the capacitance-sensing circuit is disposed. The first capacitor may be coupled to a first pin and the second capacitor may be coupled to a second pin. The first pin and second pin may be GPIO pins of the capacitance-sensing circuit of a processing device comprising the capacitance-sensing circuit.

In a further embodiment, the processing logic stores the RX signal in the first capacitor during a positive portion of a TX cycle of the TX signal and stores the RX signal in the second capacitor during a negative portion of the TX cycle. The first capacitor and the second capacitor are configured to retain an error from cycle to cycle of the TX signal.

In a further embodiment, the processing logic selectively controls a first programmable current source to source current on the input node during a positive portion of a TX cycle of the TX signal and selectively controls a second programmable current source to sink current on the input node during a negative portion of the TX cycle. The first programmable current source and second programmable current source may be selectively controlled in a non-overlapping manner.

In another embodiment, the processing logic at block 1306 selectively couples the first capacitor to the input node in time to capture the RX signal from a first edge of the TX signal. The processing logic at block 1306 also selectively coupled the second capacitor to the input node in a non-overlapping manner and in time to capture the RX signal from a second edge of the TX signal.

In another embodiment, the processing logic connects a first capacitor and counts the time to correct signal to Vref for TX rising. The processing logic connects a second capacitor and counts the time to correct signal to Vref (opposite polarity) for TX falling. The processing logic keeps track of both rise and fall times and over multiple cycles (e.g., after a given number of cycles), the total count time is equal to the result.

The processing logic may perform other operations as described above with respect to FIGS. 1-12B.

The methods described above regarding input signal attenuation can be implemented by the CSD Mutual Cap component 120, which may be implemented in a capacitive touch screen controller. In one embodiment, the capacitive touch screen controller is the TrueTouch® capacitive touch-screen controllers, such as the CY8CTMA3xx family of TrueTouch® Multi-Touch All-Points touchscreen controllers, developed by Cypress Semiconductor Corporation of San Jose, Calif. The TrueTouch® capacitive touchscreen controllers sensing technology to resolve touch locations of multiple fingers and a stylus on the touch-screens, supports leading operating systems, and is optimized for low-power multi-touch gesture and all-point touchscreen functionality. Alternatively, the touch position calculation features may be implemented in other touchscreen controllers, or other touch controllers of touch-sensing devices. In one embodiment, the touch position calculation features may be implemented with other touch filtering algorithms as would be appreciated by one of ordinary skill in the art having the benefit of this disclosure.

The embodiments described herein may be used in various designs of mutual-capacitance sensing arrays of the capacitance sensing system, or in self-capacitance sensing arrays. In one embodiment, the capacitance sensing system detects multiple sense elements that are activated in the array, and can analyze a signal pattern on the neighboring sense elements to separate noise from actual signal. The embodiments described herein are not tied to a particular capacitive sensing solution and can be used as well with other sensing solutions, including optical sensing solutions, as would be appreciated by one of ordinary skill in the art having the benefit of this disclosure.

In the above description, numerous details are set forth. It will be apparent, however, to one of ordinary skill in the art having the benefit of this disclosure, that embodiments of the present invention may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "encrypting," "decrypting," "storing," "providing," "deriving," "obtaining," "receiving," "authenticating," "deleting," "executing," "requesting," "communicating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

Embodiments descried herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store one or more sets of instructions. The term "computer-readable medium" shall also be taken to include any medium that is capable of storing, encoding or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details such as examples of specific systems, components, methods and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth above are merely exemplary. Particular implementations may vary from these exemplary details and still be contemplated to be within the scope of the present invention.

It is to be understood that the above description is intended to be illustrative and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A capacitance-sensing circuit comprising:
   an input node coupled to a capacitance sense pin coupled to a first electrode of a sense array, wherein the input node is a single signal path of a sensing channel of the capacitive-sensing circuit;
   a transmit (TX) signal generation circuit to generate a TX signal to drive a second electrode of the sense array;
   logic circuitry coupled to the TX signal generation circuit, wherein the logic circuitry is configured to selectively couple a first capacitor to the single signal path and a second capacitor to the single signal path timed with the TX signal, wherein the first capacitor and the second capacitor are coupled to ground; and
   an analog-to-digital converter (ADC) coupled to receive a receive (RX) signal from the input node and to convert the RX signal into a digital value, wherein the digital value represents a mutual capacitance between the first electrode and the second electrode, wherein the ADC comprises a comparator comprising a first input coupled to the single signal path and a second input coupled to a voltage reference (Vref), wherein a direct electrical connection is formed on the single signal path between the capacitance sense pin and the first input of the comparator, wherein the logic circuitry is configured to selectively couple the first capacitor and the second capacitor to the single signal path in a non-overlapping manner and timed to capture the RX signal from a first edge of the TX signal and to capture the RX signal from a second edge of the TX signal.

2. The capacitance-sensing circuit of claim 1, wherein the first capacitor and the second capacitor are external to an integrated circuit die upon which the capacitance-sensing circuit is disposed.

3. The capacitance-sensing circuit of claim 2, further comprising:
   a first switch coupled between the single signal path and the first capacitor, wherein the logic circuitry is configured to selectively activate the first switch to selectively couple the first capacitor to the single signal path; and
   a second switch coupled between the single signal path and the second capacitor, wherein the logic circuitry is configured to selectively activate the second switch to selectively couple the second capacitor to the single signal path, wherein the logic circuitry is to activate the first switch and the second switch in a non-overlapping manner.

4. The capacitance-sensing circuitry of claim 3, wherein the first capacitor is coupled to a first pin and the second capacitor is coupled to a second pin, wherein the first pin and second pin are general-purpose input-output (GPIO) pins of a processing device comprising the capacitance-sensing circuit.

5. The capacitance-sensing circuit of claim 1, wherein the first capacitor and second capacitor are configured to store the RX signal and retain an error from cycle to cycle of the TX signal.

6. The capacitance-sensing circuit of claim 1, further comprising a first programmable current source coupled to the logic circuitry, wherein the logic circuitry is to selectively couple the first programmable current source to the single signal path to source current during a positive portion of a TX cycle of the TX signal and to sink current during a negative portion of the TX cycle.

7. The capacitance-sensing circuit of claim 1, further comprising:
   a first programmable current source coupled to the logic circuitry; and
   a second programmable current source coupled to the logic circuitry, wherein the logic circuitry is to selectively couple the first programmable current source and the second programmable current source to the single signal path, wherein the first programmable current source and second programmable current source are separate sink and source current sources, and wherein the first programmable current source is to source current on the single signal path during a positive portion of a TX cycle of the TX signal and the second programmable current source is to sink current on the single signal path single signal path during a negative portion of the TX cycle.

8. The capacitance-sensing circuit of claim 1, wherein the comparator is to output when the RX signal crosses the voltage reference, wherein the ADC further comprises:
   a flip-flop coupled to the output of the comparator to sample the output of the comparator;
   a timer to reset the ADC after a time period; and
   a counter coupled to an output of the flip-flop to count a number of times the RX signal crosses the voltage reference during the time period, wherein a counter value of the counter, prior to the reset, represents the mutual capacitance between the first electrode and the second electrode.

9. The capacitance-sensing circuit of claim 1, wherein the TX signal generation circuit comprises a flip-flop coupled to receive a first signal and to output the TX signal, wherein the TX signal is delayed by the flip-flop, and wherein the logic circuitry comprises:
   a NOR gate coupled to receive the first signal and the TX signal and to output a first control signal to selectively couple the first capacitor to the single signal path; and
   a AND gate coupled to receive the first signal and the TX signal and to output a second control signal to selectively couple the second capacitor to the single signal path.

10. A method comprising:
    driving a first electrode of a sense array with a transmit (TX) signal by a capacitance-sensing circuit;
    receiving a receive (RX) signal on a capacitance sense pin coupled to a second electrode of the sense array, wherein the capacitance sense pin is coupled to an input node of a multiplexer (MUX) bus of the capacitance-sensing circuit, wherein the input node is a single signal path of a sensing channel of the capacitive-sensing circuit;
    selectively coupling a first capacitor to the single signal path and a second capacitor to the single signal path timed with the TX signal, wherein the first capacitor and the second capacitor are coupled to ground; and
    converting the RX signal into a digital value by an analog-to-digital converter (ADC) of the capacitance-sensing circuit, wherein the ADC comprises a comparator comprising a first input coupled to the single signal path and a second input coupled to a voltage reference (Vref), wherein the digital value represents a mutual capacitance between the first electrode and the second electrode, wherein a direct electrical connection is formed on the single signal path between the capacitance sense pin and the first input of the comparator, wherein the selectively coupling comprises:
selectively coupling the first capacitor to the single signal path in time to capture the RX signal from a first edge of the TX signal; and
selectively coupling the second capacitor to the single signal path in a non-overlapping manner and in time to capture the RX signal from a second edge of the TX signal.

11. The method of claim 10, wherein the selectively coupling comprises:
selectively activating a first switch coupled between the single signal path and the first capacitor to selectively couple the first capacitor to the single signal path; and
selectively activating a second switch coupled between the single signal path and the second capacitor to selectively couple the second capacitor to the single signal path.

12. The method of claim 11, wherein the first capacitor and the second capacitor are external to an integrated circuit die upon which the capacitance-sensing circuit is disposed, wherein the first capacitor is coupled to a first pin and the second capacitor is coupled to a second pin, and wherein the first pin and second pin are general-purpose input-output (GPIO) pins of the capacitance-sensing circuit of a processing device.

13. The method of claim 10, further comprising:
storing the RX signal in the first capacitor during a positive portion of a TX cycle of the TX signal; and
storing the RX signal in the second capacitor during a negative portion of the TX cycle, wherein the first capacitor and the second capacitor are configured to retain an error from cycle to cycle of the TX signal.

14. The method of claim 10, further comprising:
selectively controlling a first programmable current source to source current on the single signal path during a positive portion of a TX cycle of the TX signal; and
selectively controlling a second programmable current source to sink current on the single signal path during a negative portion of the TX cycle, wherein the first programmable current source and second programmable current source are selectively controlled in a non-overlapping manner.

15. An apparatus comprising:
a first external capacitor coupled to ground;
a second external capacitor coupled to ground;
a processing device comprising:
an analog-to-digital converter (ADC) comprising a comparator comprising a first input coupled to a single signal path and a second input coupled to a voltage reference (Vref);
a multiplexer bus coupled to single signal path of the ADC; and
logic circuitry configured to selectively couple the first external capacitor and the second external capacitor to the single signal path in a non-overlapping manner;
wherein the processing device is configured to drive a first electrode of a sense array with a transmit (TX) signal and to measure a receive (RX) signal on the multiplexer bus and convert the RX signal to a digital value by the ADC, wherein the multiplexer bus is coupled to a capacitance sense pin of the processing device, and wherein a direct electrical connection is formed on the single signal path between the capacitance sense pin and the first input of the comparator;
a first switch coupled between the single signal path and the first capacitor, wherein the logic circuitry is configured to selectively activate the first switch to selectively couple the first capacitor to the single signal path; and
a second switch coupled between the single signal path and the second capacitor, wherein the logic circuitry is configured to selectively activate the second switch to selectively couple the second capacitor to the single signal path, wherein the logic circuitry is to activate the first switch and the second switch in the non-overlapping manner.

16. The apparatus of claim 15, wherein the comparator is to output when the RX signal crosses the voltage reference, wherein the ADC comprises:
a flip-flop coupled to the output of the comparator to sample the output of the comparator;
a timer to reset the ADC after a time period; and
a counter coupled to an output of the flip-flop to count a number of times the RX signal crosses the voltage reference during the time period, wherein a counter value of the counter, prior to the reset, represents the mutual capacitance between the first electrode and the second electrode.

* * * * *